United States Patent
Chiu et al.

(10) Patent No.: US 6,498,054 B1
(45) Date of Patent: Dec. 24, 2002

(54) METHOD OF UNDERFILLING A FLIP-CHIP SEMICONDUCTOR DEVICE

(75) Inventors: Shih-Kuang Chiu, Taichung (TW); Ying-Chou Tsai, Hsinchu (TW); Han-Ping Pu, Taipei Hsien (TW)

(73) Assignee: Siliconware Precision Industries Co., Ltd. (TW)

( * ) Notice: Subject to any disclaimer, the term of this patent is extended or adjusted under 35 U.S.C. 154(b) by 70 days.

(21) Appl. No.: 09/585,964

(22) Filed: Jun. 2, 2000

(51) Int. Cl.[7] ............................................... H01L 21/44
(52) U.S. Cl. ...................... 438/108; 438/126; 438/127; 257/778; 257/787
(58) Field of Search ................................ 438/108, 126, 438/127; 257/778, 787

(56) References Cited

U.S. PATENT DOCUMENTS

| | | |
|---|---|---|
| 5,355,580 A | * 10/1994 | Tsukada |
| 5,710,071 A | 1/1998 | Beddingfield et al. |
| 5,942,798 A | 8/1999 | Chiu |

* cited by examiner

*Primary Examiner*—Long Pham
(74) *Attorney, Agent, or Firm*—Peter F. Corless; Steven M. Jensen; Edwards & Angell, LLP

(57) ABSTRACT

A flip-chip underfill method is proposed for the purpose of underfilling a gap formed beneath a semiconductor chip mounted in a flip-chip manner over an underlying surface. The flip-chip underfill method comprises the following procedural steps of: preparing a dispensing needle having an outlet; then, moving the dispensing needle in such a manner as to position the outlet thereof at a corner point between the upper surface and the sidewall of the semiconductor chip; and finally injecting resin at the targeted corner point, which allows the injected resin from the outlet of the dispensing needle to flow down along the sidewall of the semiconductor chip to the edge of the lower surface of the semiconductor chip and subsequently fill into the gap through capillary action. This flip-chip underfill method is more advantageous to use than the prior art since it allows the dispensing needle to be unobstructed by any gold wires or passive components mounted beside the chip and also allows the injected resin to be substantially confined to the targeted area beneath the chip without being wasted.

8 Claims, 3 Drawing Sheets

METHOD OF UNDERFILLING A FLIP-CHIP SEMICONDUCTOR DEVICE

BACKGROUND OF THE INVENTION

1. Field of the Invention

This invention relates to semiconductor device packaging technology, and more particularly, to a method of underfilling a flip-chip semiconductor device.

2. Description of Related Art

FIG. 1A shows a flip-chip semiconductor package which utilizes a conventional flip-chip underfill method. As shown, this package includes a semiconductor chip 1 whose circuit surface 11 (the side where active semiconductor and circuit elements are formed) is provided with a plurality of solder bumps 6. Through reflow treatment, the circuit surface 11 of the chip 1 is bonded and electrically coupled to the top surface 31 of a substrate 3. After this treatment, a gap 5 is left between the circuit surface 11 of the chip 1 and the top surface 31 of the substrate 3. It is required to perform a flip-chip underfill process to fill up this gap 5 with resin for the purpose of increasing the solder joint between the solder bumps 6 and the substrate 3 and preventing the solder bumps 6 from being damaged. A conventional method for this purpose is to use a dispensing needle 2 and place the outlet of the dispensing needle 2 beside the chip 1 at a position below the circuit surface 11 of the chip 1 and above the top surface 31 of the substrate 3. The injected resin will then spread out over the top surface 31 of the substrate 3 and fill into the gap 5 through capillary action until the gap 5 is entirely filled with the resin.

One drawback to the forgoing flip-chip underfill method, however, is that the injected resin from the dispensing needle 2 would spread randomly over the top surface 31 of the substrate 3, making some portions of the resin flash to other surface part beyond the gap 5. As a result, a cleaning process is required after the flip-chip underfill method is completed, which would increase the overall manufacture cost.

Still one drawback is that the foregoing flip-chip underfill method is unsuitable for use on a stacked type of flip-chip package configuration, such the one shown in FIG. 1B. As show, this package configuration includes two chips: a first chip 9 and a second chip 1. The first chip 9 is wire bonded to a set of gold wires 90 for electrically coupling to substrate, while the second chip 1 is bonded and electrically coupled to the first chip 9 through a plurality of solder bumps. In this case, the dispensing needle 2 would be obstructed by the gold wires 90 from lowering to a suitable position where resin injection can be made.

Moreover, the foregoing flip-chip underfill method is also unsuitable for use on a package configuration with passive components such as the one shown in FIG. 1C. As shown, this package configuration includes a semiconductor chip 1 and a plurality of passive components 32 mounted on the top surface 31 of a substrate 3. In this case, the dispensing needle 2 would be obstructed by the passive components 32 from lowering to a suitable position where resin injection can be made.

The U.S. Pat. No. 5,942,798 entitled "APPARATUS AND METHOD FOR AUTOMATING THE UNDERFILL OF FLIP-CHIP DEVICES" discloses an advanced flip-chip underfill technique, which is briefly described in the following with reference to FIG. 2. As shown, this patented flip-chip underfill technology is utilized on a package configuration having a semiconductor chip 1 mounted in a flip-chip manner on a substrate 3, and is characterized in the forming of an underfill dam 7 beside the chip 1 for preventing the injected resin from the dispensing needle 2 from spreading to other areas beyond the intended area. One drawback to this patented technology, however, is that the forming of the underfill dam 7 requires additional layout areas over the substrate 3, and thus would make the overall package configuration less compact.

The U.S. Pat. No. 5,710,071 entitled "PROCESS FOR UNDERFILLING A FLIP-CHIP SEMICONDUCTOR DEVICE" discloses another flip-chip underfill technique, which is briefly described in the following with reference to FIG. 3.

As shown, this patented flip-chip underfill technology is utilized on a package configuration having a semiconductor chip 1 mounted in a flip-chip manner on a substrate 3, and is characterized in the forming of an opening 8 in the substrate 3 at a position directly beneath the center of the chip 1. This opening 8 allows the air in the gap 5 to be substantially entirely dispelled out therethrough by the injected resin from the dispensing needle 2, so that the filled resin beneath the chip 1 would be substantially free of voids. One drawback to this patented technology, however, is that it requires the dispensing needle 2 to move around the chip 1 in order to inject resin around the chip 1, and therefore, in the case that gold wires or passive components are mounted beside the chip 1, the dispensing needle 2 would be obstructed from entering these positions.

SUMMARY OF THE INVENTION

It is therefore an objective of this invention to provide a method for underfilling a flip-chip semiconductor device, by which the resin injection would be unobstructed by gold wires or passive components beside the flipped chip.

It is another objective of this invention to provide a method for underfilling a flip-chip semiconductor device, which allows the injected resin to be confined to the intended area so that no resin would be wasted.

In accordance with the foregoing and other objectives, the invention proposes a new flip-chip underfill method.

In one embodiment, the flip-chip underfill method of the invention comprises the following procedural steps: preparing a substrate having a front surface and a back surface; preparing a semiconductor chip having an active surface and an inactive surface; providing a plurality of solder bumps on the active surface of the semiconductor chip; mounting the semiconductor chip in a flip-chip manner over the front surface of the substrate, which forms a gap between the active. surface of the semiconductor chip and the top surface of the substrate; and moving a dispensing needle having an outlet in such a manner as to position the the outlet of the dispensing needle at a corner point between the inactive surface and the sidewall of the semiconductor chip, allowing injected resin from the outlet of the dispensing needle to flow down along the sidewall of the semiconductor chip to the edge of the active surface of the semiconductor chip and subsequently fill into the gap through capillary action.

In another embodiment, the flip-chip underfill method of the invention comprises the following procedural steps: preparing a substrate having a front surface and a back surface; preparing a first semiconductor chip having an active surface and an inactive surface; preparing a second semiconductor chip having an active surface and an inactive surface; mounting the second semiconductor chip on the front surface of the substrate; providing a plurality of solder bumps on the active surface of the first semiconductor chip;

mounting the first semiconductor chip in a flip-chip manner over the active surface of the second semiconductor, which forms a gap between the active surface of the first semiconductor chip and the active surface of the second semiconductor chip; moving a dispensing needle having an outlet in such a manner as to position the outlet of the dispensing needle at a corner point between the inactive surface and the sidewall of the first semiconductor chip, allowing injected resin from the outlet of the dispensing needle to flow down along the sidewall of the first semiconductor chip to the edge of the active surface of the first semiconductor chip and subsequently fill into the gap through capillary action.

Fundamentally speaking, the flip-chip underfill method of the invention can be utilized for underfilling a gap formed beneath a semiconductor chip mounted in a flip-chip manner over an underlying surface, and comprises the steps of preparing a dispensing needle having an outlet; moving the dispensing needle in such a manner as to position the outlet thereof at a corner point between the upper surface and the sidewall of the semiconductor chip; and injecting resin at the targeted corner point, which allows injected resin from the outlet of the dispensing needle to flow down along the sidewall of the semiconductor chip to the edge of a lower surface of the semiconductor chip and subsequently fill into the gap through capillary action.

The flip-chip underfill method of the invention is more advantageous to use than the prior art since it allows the dispensing needle to be unobstructed by the gold wires and also allows the injected resin to be substantially confined to the targeted area without being wasted.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

Figure 1A:
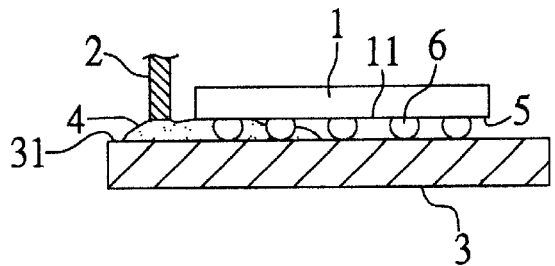
FIGS. 1A–1C (PRIOR ART) are schematic sectional diagrams used to depict the use of a first conventional flip-chip underfill method respectively on three different types of semiconductor package configurations.
Figure 1B:
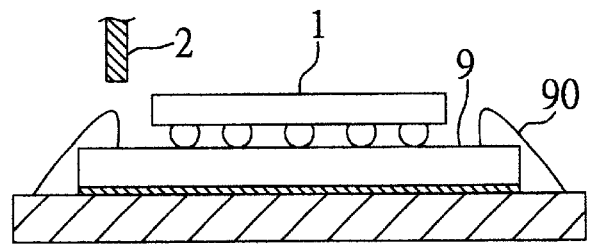
Figure 1C:
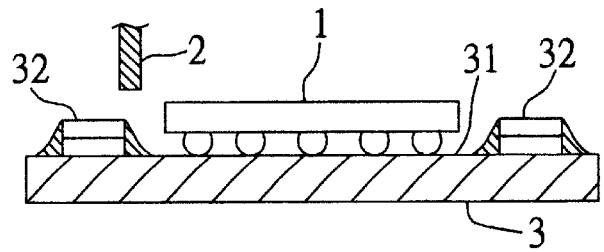
Figure 2:
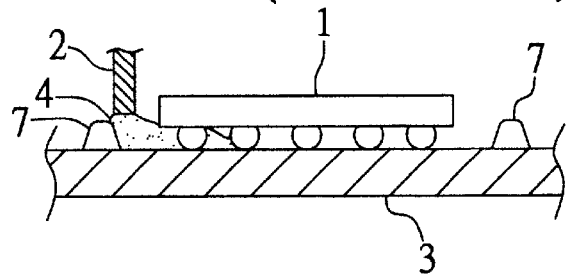
FIG. 2 (PRIOR ART) is a schematic sectional diagram used to depict a second conventional flip-chip underfill method.
Figure 3:
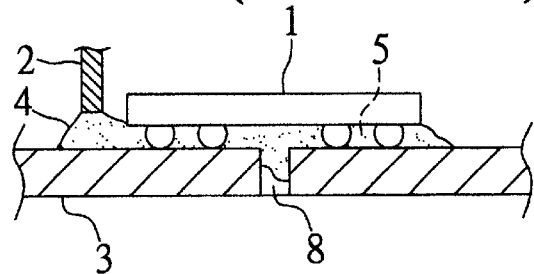
FIG. 3 (PRIOR ART) is a schematic sectional diagram used to depict a third conventional flip-chip underfill method.

In accordance with the invention, two preferred embodiments are disclosed in full details in the following with reference to FIG. 4A and FIG. 4B, respectively.

First Preferred Embodiment

The first preferred embodiment of the flip-chip underfill method of the invention is disclosed in full details in the following with reference to FIG. 4A.

As shown, the flip-chip underfill method of the invention is here utilized on a stacked type of semiconductor package configuration having a first. chip 10 and a second chip 11. The first chip 10 has an active surface 100 and an inactive surface 101, and is mounted in a flip-chip manner through a plurality of solder bumps 60 over the second chip 11, while the second chip 11 is attached through silver paste 12 over a substrate 30. Further, the second chip 11 is electrically coupled to the substrate 30 through a set of gold wires 90. After reflow treatment, a gap 50 is left between the active surface 100 of the first chip 10 and the top surface 110 of the second chip 11.

Due to the existence of the gold wires 90, the conventional methods mentioned in the background section of this specification would be unusable for flip-chip underfill. By the invention, the dispensing needle 20 is moved in such a manner as to position its outlet at a corner point between the inactive surface 101 and the sidewall 102 of the first chip 10, allowing the injected resin to flow down along the sidewall 102 of the first chip 10 to the edge of the active surface 100 and then fill into the gap 50 through capillary action. Since the injected resin would stick to the sidewall 102 of the first chip 10 before entering the gap 50, it can hardly stray to other areas beyond the gap 50, allowing the injected resin to be substantially unwasted.

It can be learned from the foregoing description that the invention is more advantageous to use than the prior art since it allows the dispensing needle to be unobstructed by the gold wires 90 and also allows the injected resin to be substantially confined to the targeted area without being wasted.

Second Preferred Embodiment

The second preferred embodiment of the flip-chip underfill method of the invention is disclosed in full details in the following with reference to FIG. 4B.

As shown, the flip-chip underfill method of the invention is here utilized on a single-chip semiconductor package configuration including only one chip 10 mounted in a flip-chip manner over a substrate 30 through a plurality of solder bumps 6 and further including a plurality of passive components 301 mounted beside the chip 10. Due to the existence of the passive components 301, the conventional methods mentioned in the background section of this specification would be unusable for flip-chip underfill. By the invention, the dispensing needle 20 is positioned in such a manner as to position its outlet at a corner point between the inactive surface 101 and the sidewall 102 of the chip 10, allowing the injected resin to flow down along the sidewall 102 of the chip 10 to the edge of the active surface 100 and subsequently fill into the gap 50 through capillary action. Since the injected resin would stick to the sidewall 102 of the first chip 10 before entering the gap 50, it can hardly stray to other areas beyond the gap 50, allowing the injected resin to be substantially unwasted.

Figure 5A:
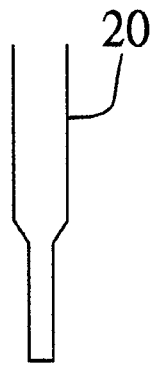
FIGS. 5A–5C are schematic diagrams showing three different kinds of dispensing needles that can be utilized by the invention.
Figure 5B:
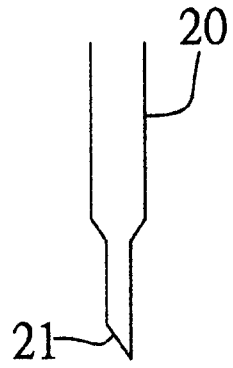
Figure 5C:
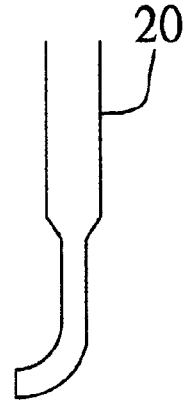

FIGS. 5A–5C are schematic diagrams showing three different kinds of dispensing needles that can be utilized by the invention. FIG. 5A shows a typical dispensing needle 20 having a flat outlet. FIG. 5B shows a dispensing needle 20 having a slanted outlet 21. FIG. 5C shows a dispensing needle 20 having a perpendicularly-bent outlet.

Figure 4A:
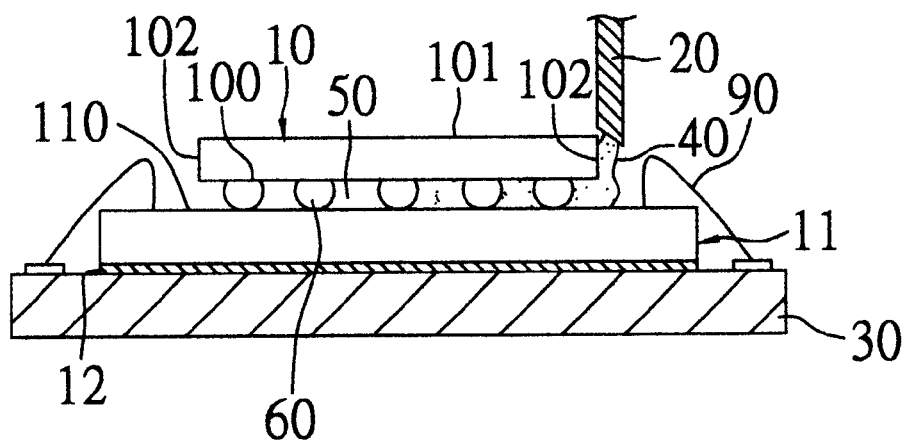
FIG. 4A is a schematic sectional diagram used to depict a first preferred embodiment of the invention which is utilized on a package configuration with gold wires.
Figure 4B:
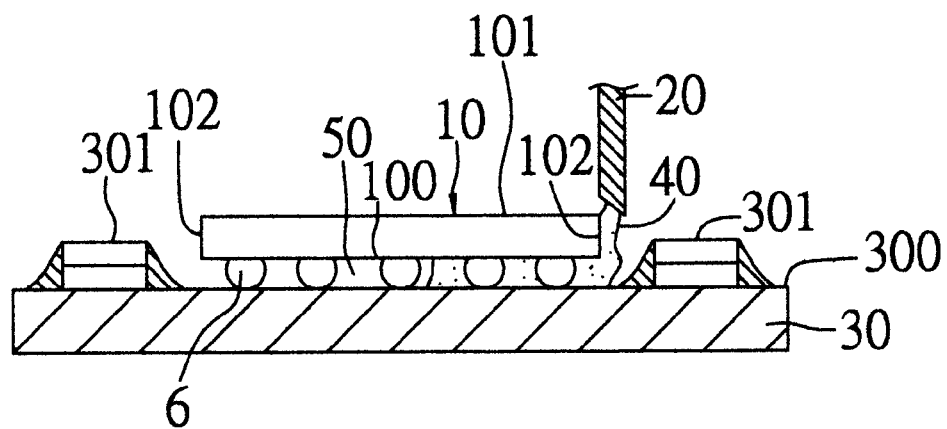
FIG. 4B is a schematic sectional diagram used to depict a second preferred embodiment of the invention which is utilized on another type of package configuration with passive components on substrate.

In FIG. 4A and FIG. 4B, the positioning of the outlet of the dispensing needle 20 at a corner point between the inactive surface 101 and the sidewall 102 of the chip 10 should be precisely controlled through a high-definition visual control system (not shown) so that the dispensing needle 20 can be precisely positioned without bumping into the chip 1. A smaller outlet would allow the resin injection to be more controllable.

In conclusion, the invention provides a new flip-chip underfill method which serves as a solution to the aforementioned problems of the prior art, making the package more reliable to use.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for underfilling a gap formed beneath a semiconductor chip mounted in a flip-chip manner over an underlying surface, the method comprising the steps of:

preparing a dispensing needle having an outlet, wherein the outlet is slanted in shape;

moving the dispensing needle having the slanted outlet in such a manner as to position the outlet of the dispensing needle at a corner point between an upper surface and sidewall of the semiconductor chip, wherein the outlet of the dispensing needle is made to face against the targeted corner point of the semiconductor chip when performing underfill; and injecting resin at the targeted corner point of the semiconductor chip, allowing the injected resin from the outlet of the dispensing needle to flow down along the sidewall of the semiconductor chip to an edge of a lower surface of the semiconductor chip and subsequently fill into the gap through capillary action.

2. A flip-chip underfill method for underfilling a gap formed beneath a semiconductor chip mounted in a flip-chip manner over an underlying surface, the flip-chip underfill method comprising the steps of:

preparing a dispensing needle having an outlet, wherein the outlet is perpendicularly bent;

moving the dispensing needle in such a manner as to position the outlet thereof at a corner point between an upper surface and sidewall of the semiconductor chip, wherein the outlet is made to race against the targeted corner point of the semiconductor chip when performing underfill; and injecting resin at the targeted corner point, allowing the injected resin from the outlet of the dispensing needle to flow down along the sidewall of the semiconductor chip to an edge of a lower surface of the semiconductor chip and subsequently fill into the gap through capillary action.

3. The method of claim 1, wherein the underlying surface is an active surface of another semiconductor chip.

4. The method of claim 1, wherein the underlying surface is a surface of a substrate.

5. The method of claim 1, wherein the underlying surface is a surface of a printed circuit board.

6. The flip-chip underfill method of claim 1, wherein the underlying surface is an active surface of another semiconductor chip.

7. The flip-chip underfill method of claim 1, wherein the underlying surface is a surface of a substrate.

8. The flip-chip underfill method of claim 1, wherein the underlying surface is a surface of a printed circuit board.

* * * * *